(12) United States Patent
Lee et al.

(10) Patent No.: US 12,408,434 B2
(45) Date of Patent: Sep. 2, 2025

(54) DISPLAY MODULE INCLUDING GLASS SUBSTRATE HAVING SIDE WIRINGS, AND DISPLAY MODULE MANUFACTURING METHOD

(71) Applicant: SAMSUNG ELECTRONICS CO., LTD., Suwon-si (KR)

(72) Inventors: Changjoon Lee, Suwon-si (KR); Kyungwoon Jang, Suwon-si (KR); Kwangrae Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 572 days.

(21) Appl. No.: 17/873,969

(22) Filed: Jul. 26, 2022

(65) Prior Publication Data
US 2022/0359574 A1 Nov. 10, 2022

Related U.S. Application Data

(63) Continuation of application No. PCT/KR2021/001761, filed on Feb. 10, 2021.

(30) Foreign Application Priority Data

Mar. 3, 2020 (KR) .................. 10-2020-0026591

(51) Int. Cl.
*H10D 86/60* (2025.01)
*H01L 25/075* (2006.01)
(Continued)

(52) U.S. Cl.
CPC ......... *H10D 86/60* (2025.01); *H01L 25/0753* (2013.01); *H10D 86/0212* (2025.01);
(Continued)

(58) Field of Classification Search
CPC .. H10H 20/8506; H10H 20/857; H10H 20/85; H10H 20/853; H10H 20/00–882;
(Continued)

(56) References Cited

U.S. PATENT DOCUMENTS

| 6,646,284 B2 | 11/2003 | Yamazaki et al. |
| 7,102,231 B2 | 9/2006 | Yamazaki et al. |

(Continued)

FOREIGN PATENT DOCUMENTS

| JP | 2005-191097 A | 7/2005 |
| JP | 2015-175969 A | 10/2015 |

(Continued)

OTHER PUBLICATIONS

International Search Report (PCT/ISA/210) issued May 27, 2021 by the International Searching Authority in counterpart International Application No. PCT/KR2021/001761.
(Continued)

*Primary Examiner* — Moin M Rahman
(74) *Attorney, Agent, or Firm* — Sughrue Mion, PLLC

(57) ABSTRACT

A display module includes a glass substrate having a TFT layer and a driver circuit disposed on surfaces thereof, LEDs electrically connected to the TFT layer; first connection pads formed in an edge region of the front surface; second connection pads formed in an edge region of the rear surface; and side wirings in recessed grooves arranged at intervals on a side of the glass substrate so that the side wirings are located at concave positions from the side of the glass substrate, the side wirings electrically connecting the first and second connection pads, wherein the first and second connection pads are spaced a predetermined distance inward from the side of the glass substrate, and the recessed grooves are arranged so that opposite ends of the recessed
(Continued)

grooves are located at positions corresponding to the first and second connection pads, respectively.

8 Claims, 18 Drawing Sheets

(51) Int. Cl.
  *H10D 86/01* (2025.01)
  *H10D 86/40* (2025.01)
  *H10H 20/01* (2025.01)
  H10H 20/857 (2025.01)

(52) U.S. Cl.
  CPC ......... *H10D 86/411* (2025.01); *H10D 86/441* (2025.01); *H10H 20/01* (2025.01); *H10H 20/857* (2025.01)

(58) Field of Classification Search
  CPC ... H10H 29/00–142; H10H 29/30–962; H10H 20/814–8142; H10H 20/01; H10H 20/821; H01L 25/167; H01L 25/0753; H01L 25/13; H01L 23/31; H01L 23/528; H01L 21/768; H01L 21/76895; H01L 24/75; H01L 24/98; H01L 2221/68322; H01L 2221/68354; H01L 2224/75822; H01L 2224/7598; H01L 2924/12041; H01L 21/6835; H01L 24/95; H01L 2224/73204; F21K 9/00–278; H10D 86/60; H10D 86/0212; H10D 86/411; H10D 86/441; H10K 50/11; H10K 50/15; H10K 50/16; H10K 50/171; H10K 2101/30; H10K 2101/40; H10K 2102/351; H10K 50/852; H10K 59/35; H10K 59/12; H10K 50/156; H10K 2101/00; H10K 50/844; H10K 59/873; H10K 77/111; H10K 59/131; H10K 59/129; H10K 2102/311; H10K 2102/361; B60K 37/02; B60K 2370/1523; B60K 2370/331; B60K 2370/52; B60R 1/00; G02F 1/133305; G02F 1/133388; G02F 1/13452; G02F 1/136254; G02F 2201/50; G02F 2202/28; Y02E 10/549; G09G 2300/0426
  See application file for complete search history.

(56) References Cited

U.S. PATENT DOCUMENTS

| | | | |
|---|---|---|---|
| 9,205,528 | B2 | 12/2015 | Okafuji et al. |
| 9,444,015 | B2 | 9/2016 | Bower et al. |
| 9,902,037 | B2 | 2/2018 | Okafuji et al. |
| 10,156,748 | B2 | 12/2018 | Wu et al. |
| 10,181,507 | B2 | 1/2019 | Bower et al. |
| 2013/0101790 | A1 | 4/2013 | Okafuji et al. |
| 2016/0067843 | A1 | 3/2016 | Okafuji et al. |
| 2020/0013803 | A1 | 1/2020 | Jang et al. |
| 2020/0043401 | A1* | 2/2020 | Yokoyama ........... G09G 3/3233 |
| 2020/0135126 | A1 | 4/2020 | Yokoyama et al. |
| 2021/0135076 | A1 | 5/2021 | Jung et al. |

FOREIGN PATENT DOCUMENTS

| | | |
|---|---|---|
| KR | 10-0741593 B1 | 7/2007 |
| KR | 10-0791736 B1 | 1/2008 |
| KR | 10-2013-0045188 A | 5/2013 |
| KR | 10-1341771 B1 | 12/2013 |
| KR | 10-2017-0065462 A | 6/2017 |
| KR | 10-1834369 B1 | 3/2018 |
| KR | 10-2020-0004402 A | 1/2020 |
| KR | 10-2020-0004751 A | 1/2020 |
| KR | 10-2020-0008433 A | 1/2020 |

OTHER PUBLICATIONS

Written Opinion (PCT/ISA/237) issued May 27, 2021 by the International Searching Authority in counterpart International Application No. PCT/KR2021/001761.

Communication dated Sep. 20, 2024, issued by the Korean Patent Office in Korean Application No. 10-2020-0026591.

* cited by examiner

DISPLAY MODULE INCLUDING GLASS SUBSTRATE HAVING SIDE WIRINGS, AND DISPLAY MODULE MANUFACTURING METHOD

CROSS-REFERENCE TO RELATED APPLICATIONS

This application is a bypass continuation of International Application No. PCT/KR2021/001761, filed on Feb. 10, 2021, which is based on and claims priority to Korean Patent Application No. 10-2020-0026591, filed on Mar. 3, 2020, in the Korean Intellectual Property Office, the disclosures of which are incorporated by reference herein in their entireties.

TECHNICAL FIELD

This disclosure relates to a display module and, more particularly to, a display module having side wirings formed on an edge region of a glass substrate and a display module manufacturing method.

BACKGROUND ART

A display module to which a micro light emitting diode (LED) is applied is manufactured in a bezel-less type capable of minimizing an inactive region in which an image is not displayed, in order to minimize the visibility of a seam between each display module when a plurality of display modules are connected.

In order to implement a bezel-less type display module, a driver circuit is disposed on a rear surface of a glass substrate for driving a thin film transistor (TFT) circuit formed on the front surface of the glass substrate. In this case, in order to electrically interconnect the TFT circuit and the driver circuit, side wirings may be formed on an edge region of the glass substrate or wirings through a through-hole penetrating the front and rear surfaces of the glass substrate is essential.

In the related-art, in order to form side wirings, a process such as transfer of a conductive paste, masking and sputtering using a tape or stamping, printing wirings using a conductive ink, a partial etching through a chemical and physical method after forming a conductive layer, etc., was performed. However, since the side wirings processes have to be formed three-dimensionally along the bottom surface, the side, and the rear surface of the glass substrate, a three-dimensional masking process is performed before forming the side wirings. However, since the three-dimensional masking process has a high technical difficulty, it is difficult to implement fine pitch between side wirings and improving yield may not be expected.

Since the side wirings are formed at the outermost portion of the glass substrate, thus having vulnerability to scratch and static electricity, additional processes are required.

When an electrical connection between the TFT circuit and the driver circuit is performed using the through-hole, it is not easy to form a robust conductive layer inside a fine through-hole of several tens of micrometers, and due to a process of processing a through-hole in a state in which the TFT circuit is formed on the front surface of the glass substrate and forming a conductive layer in the through-hole, there may be a problem of high cost and difficulty in improving yields.

DISCLOSURE

An object of the disclosure is to provide a display module including a glass substrate having side wirings formed at a concave position of a glass substrate from the outermost portion of the glass substrate and a method of manufacturing the display module.

In accordance with an aspect of the disclosure, a display module includes a glass substrate including a thin film transistor (TFT) layer arranged on a front surface of the glass substrate; a driver circuit disposed on a rear surface of the glass substrate, the driver circuit configured to drive the TFT layer; a plurality of light emitting diodes (LEDs) electrically connected to the TFT layer of the glass substrate; a plurality of first connection pads formed in an edge region of the front surface of the glass substrate so as to be electrically connected, through wiring, to a TFT circuit provided on the TFT layer; a plurality of second connection pads formed in an edge region of the rear surface of the glass substrate so as to be electrically connected to the driver circuit through wiring; and a plurality of side wirings formed in a plurality of recessed grooves arranged at intervals on a side of the glass substrate so that the plurality of side wirings are located at concave positions from the side of the glass substrate, the plurality of side wirings electrically connecting the plurality of first connection pads to the plurality of second connection pads, wherein the plurality of first connection pads and the plurality of second connection pads are spaced a predetermined distance inward from the side of the glass substrate, and wherein the plurality of recessed grooves are arranged so that opposite ends of the plurality of recessed grooves are located at positions corresponding to the plurality of first connection pads and the plurality of second connection pads, respectively.

Each of the plurality of recessed grooves may include a chamfered surface on at least one of a front edge of the glass substrate or a rear edge of the glass substrate.

The chamfered surface of each of the plurality of recessed grooves may include a first chamfered surface adjacent to a corresponding first connection pad of the plurality of first connection pads; and a second chamfered surface adjacent to a corresponding second connection pad of the plurality of second connection pads.

A number of the plurality of recessed grooves may be larger than or equal to a number of the plurality of first connection pads.

Each of the plurality of LEDs may include a pair of electrodes disposed on an opposite side of a light emitting surface of the plurality of LEDs.

Each of the plurality of side wirings may be formed along the front surface and the rear surface of the glass substrate, along an inner circumference of a corresponding recessed groove of the plurality of recessed grooves, and along the first chamfered surface and the second chamfered surface of the corresponding recessed groove to form one side wiring.

Each of the plurality of side wirings may be formed along the inner circumference of the corresponding recessed groove so as to be positioned between the side of the glass substrate and a center of the glass substrate.

Each of the plurality of side wirings may be deposited to cover an edge region of a front surface of the glass substrate, an edge region of a rear surface of the glass substrate, a connection pad of the TFT layer, and an inner circumference of a corresponding recessed groove of the plurality of recessed grooves.

In accordance with an aspect of the disclosure, a method of forming a plurality of side wirings of a display module including a glass substrate includes forming a thin film transistor (TFT) layer on the glass substrate; forming a mask to cover the TFT layer so as to expose an edge region of the glass substrate; forming a plurality of recessed grooves at predetermined intervals on the exposed edge region of the glass substrate; forming a conductive layer on the exposed edge region of the glass substrate; removing the mask; removing the conductive layer formed on a side of the glass substrate included in the exposed edge region of the glass substrate so as to form side wirings in an inner circumference of each of the plurality of recessed grooves; and transferring a plurality of LEDs onto the TFT layer.

The forming the plurality of recessed grooves may include penetrating the glass substrate from an upper surface of the glass substrate not covered by the mask to a lower surface of the glass substrate; and forming a chamfered surface by chamfering at least one of a front edge of each of the plurality of recessed grooves contacting a front surface of the glass substrate or a rear edge of each of the plurality of recessed grooves contacting a rear surface of the glass substrate.

The conductive layer may be formed to cover a front edge region of the front surface of the glass substrate, a rear edge region of the rear surface of the glass substrate, and a connection pad of the TFT layer.

The chamfered surface may include a first chamfered surface adjacent to each of a plurality of first connection pads formed in a front edge region of the front surface of the glass substrate and a second chamfered surface adjacent to each of a plurality of second connection pads formed in an edge region of the rear surface of the glass substrate.

The first chamfered surface and the second chamfered surface of each of the plurality of recessed grooves may be processed to be adjacent to a corresponding first connection pad of the plurality of first connection pads and a corresponding second connection pad of the plurality of second connection pads formed on the front surface and the rear surface of the glass substrate, respectively.

The forming the plurality of side wirings may include cutting a portion of the exposed edge region of the glass substrate in a direction parallel with a side of the glass substrate.

The forming the plurality of side wirings may include removing, by a laser beam, a portion of the conductive layer formed at a position other than on the plurality of recessed grooves.

Figure 1:
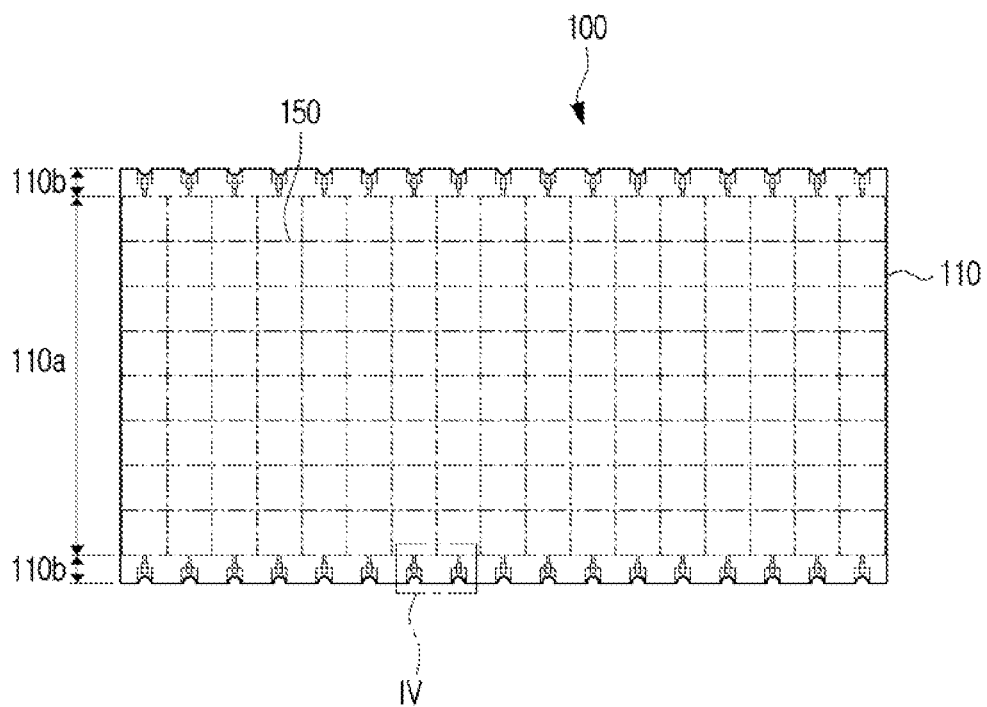
FIG. 1 is a plan view schematically illustrating a display module according to an embodiment.

Hereinafter, various embodiments will be described in detail with reference to the accompanying drawings. The embodiments described herein may be variously modified. Certain embodiments may be described in the drawings and described in detail in the detailed description. However, the specific embodiments disclosed in the accompanying drawings are to facilitate understanding various embodiments. Accordingly, it is to be understood that the disclosure is not limited to the specific embodiments disclosed in the accompanying drawings, and it is to be understood that all equivalents or alternatives included within the spirit and scope of the disclosure are included.

The terms first, second, etc. may be used to describe various components, but these components are not limited by the terms discussed above. The terms described above are used only to distinguish one component from another component.

In the disclosure, it is to be understood that the terms such as "comprise" may, for example, be used to designate a presence of a characteristic, number, step, operation, element, component, or a combination thereof, and not to preclude a presence or a possibility of adding one or more of other characteristics, numbers, steps, operations, elements, components or a combination thereof. It should be understood that, while certain components are "connected" or "coupled" to other components, they may be directly connected to or coupled to the other components, or other components may be present therebetween. On the other hand, when certain components are referred to as being "directly connected" or "directly coupled" to other components, it should be understood that there are no other components therebetween.

The terms "module" or "unit" for the components used herein perform at least one function or operation. The terms "module" or "unit" may perform a function or operation by hardware, software, or a combination of hardware and software. "Module" or "unit" may perform a function or an operation by hardware, software, or combination of hardware and software. Further, a plurality of "modules" or a plurality of "units" that should be performed in a particular hardware or performed in at least one processor may be integrated into at least one module or a plurality of "modules" other than "unit" or a plurality of "units" may be integrated as at least one module. A singular expression includes a plurality of representations unless the context clearly indicates otherwise.

In the disclosure, when describing each configuration, the term "same" used when describing each configuration, thickness, shape, orientation, etc. of the configuration, may indicate being within a predetermined error range and may not mean full equality. For example, that the thickness of one portion of the side wirings are equal to the thickness of the other portion of the side wirings may mean that it is within the numerical range considering the error range that may occur in the step of forming the side wirings. That the pitch between pixels in the display module is the same may mean being within an error range that may occur during LED transfer to the target substrate. In a plurality of LEDs, a pair of electrodes may be formed in the same direction, which means that the direction within a predetermined range may be the same. In other words, both of the pair of electrodes corresponding to each LED may extend in the same direction. The direction of extension of the electrodes may be perpendicular to a light emitting direction of the LEDs.

When it is decided that a detailed description for the known art related to the disclosure may unnecessarily obscure the gist of the disclosure, the detailed description may be shortened or omitted.

A micro light-emitting diode (micro LED or μLED) display panel may be one of a flat panel display panel including a plurality of inorganic LEDs, each of which may have a dimension of about 100 micrometers or less. A micro LED display panel may provide better contrast, response time and energy efficiency compared to liquid crystal display (LCD) panels that require backlight. Both an organic LED and a micro LED which is an inorganic light-emitting diode have good energy efficiency, but the micro LED has brightness, luminous efficiency, and lifetime longer than the organic LED (OLED).

In the disclosure, a TFT constituting a TFT layer (or a backplane) related to the micro LED is not limited to a specific structure or type. For example, the TFT may be implemented as a low temperature poly silicon (LTPS) TFT, an oxide TFT, a poly silicon or a-silicon TFT, an organic TFT, and a graphene TFT, or the like, and may be applied to a P type (or N-type) MOSFET in a Si wafer CMOS process.

In the disclosure, the glass substrate may include a TFT layer formed on a front surface thereof, and a driver circuit for driving the TFT circuit of the TFT layer on the rear surface thereof. The glass substrate may be formed of a quadrangle type. Specifically, the glass substrate may be formed of a rectangular or square type.

In the disclosure, the front surface of the glass substrate on which the TFT layer is disposed may be divided into an active region and an inactive region. The active region may correspond to a region occupied by the TFT layer on one surface of the glass substrate, and the inactive region may correspond to a region included in the edge region on the one surface of the glass substrate.

In the disclosure, the edge region of the glass substrate may be a side of the glass substrate. The edge region of the glass substrate may be a remaining region except for a region where a circuit (e.g., a TFT circuit or a driver circuit) is formed on the front and rear surfaces of the glass substrate. The edge region of the glass substrate may also include a portion of a front surface of the glass substrate and a portion of the rear surface of the glass substrate adjacent to the side of the glass substrate.

In the disclosure, the glass substrate may be formed with a connection pad electrically connected to the TFT circuit through wirings in the edge region of the front surface, and a connection pad electrically connected to the driver circuit through a wiring in the edge region of the rear surface. Each connection pad may be disposed at a concave position of the glass substrate by a predetermined distance from the side of the glass substrate.

In the disclosure, the glass substrate may include side wirings that electrically interconnect connection pads formed in each of the front surface and the rear surface of the glass substrate.

In the disclosure, the side wirings may be formed in a concave position of the glass substrate relative to the outermost portion of the glass substrate as the side wirings are formed on the recessed grooves formed on the side of the glass substrate. The side wirings may be formed by forming a conductive layer on the entire side of the glass substrate including the recessed grooves, and then removing the conductive layer of the portion where the recessed grooves are not formed.

In the disclosure, recessed grooves formed with side wirings may form chamfered surfaces at corners adjacent to the front and rear surfaces of the glass substrate, respectively. As a chamfered surface is formed in the recessed grooves, a portion connected to the front surface and the rear surface of the glass substrate adjacent to the inner circumferential surface of the recessed grooves and the recessed grooves can be gently formed. Accordingly, since the thickness of one portion of the side wirings formed at the edge of the recessed grooves may be formed to be the same as the thickness of the other portion of the side wirings, it is possible to fundamentally prevent the side wirings from being disconnected at the edge portion of the recessed grooves.

In the disclosure, a plurality of pixels may be provided in the TFT layer of the glass substrate. Each pixel may consist of a plurality of sub-pixels, and one sub-pixel may correspond to one micro LED. The TFT layer may include a TFT circuit for driving each pixel. The micro LED may be composed of an inorganic light emitting material, and may be a semiconductor chip capable of emitting light by itself when power is supplied. In addition, the micro LED may have a flip-chip structure in which an anode electrode and a cathode electrode are formed on the same surface and a light emitting surface is formed on the opposite side of the electrodes.

In this disclosure, the display module may form a black matrix between a plurality of micro LED pixels arranged on the TFT layer. The black matrix may block the leakage of light at the periphery of the micro LED pixels adjacent to each other, thereby improving the contrast ratio.

In the disclosure, the display module may further include a touch screen panel disposed at a side where the plurality of micro LEDs emit light, and in this case, the display module may include a touch screen driver for driving the touch screen panel. The display module may further include a rear substrate disposed on the rear surface of the glass substrate and electrically connected through a flexible printed circuit (FPC). The display module may further include a communication device capable of receiving data.

In the disclosure, the glass substrate on which the micro LED is mounted and the side wirings are formed may be referred to as a display module. The display module may be installed and applied to wearable devices, portable devices, handheld devices in a single unit, and electronic products or electronic parts requiring various displays, and may be applied to display devices such as monitors for personal computer (PC), high-resolution televisions (TVs) and signage (or digital signage), electronic displays, etc. through a plurality of assembly layouts, as a matrix type.

Hereinafter, a display module having a glass substrate with side wirings according to an embodiment of the disclosure will be described in detail with reference to the drawings.

Figure 2:
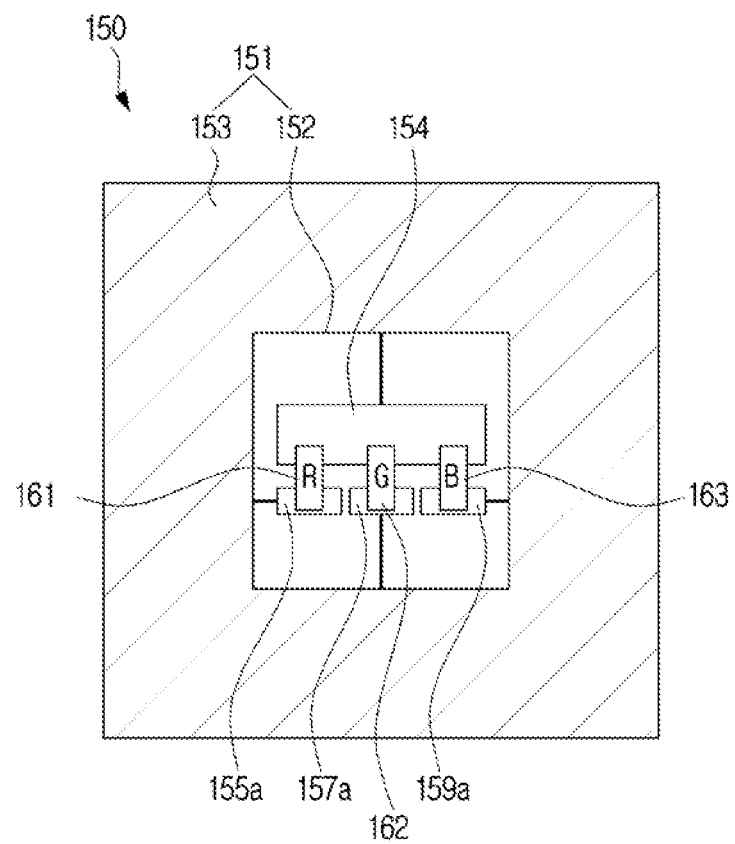
FIG. 2 is a schematic view illustrating a pixel arranged on a TFT layer.
Figure 3:
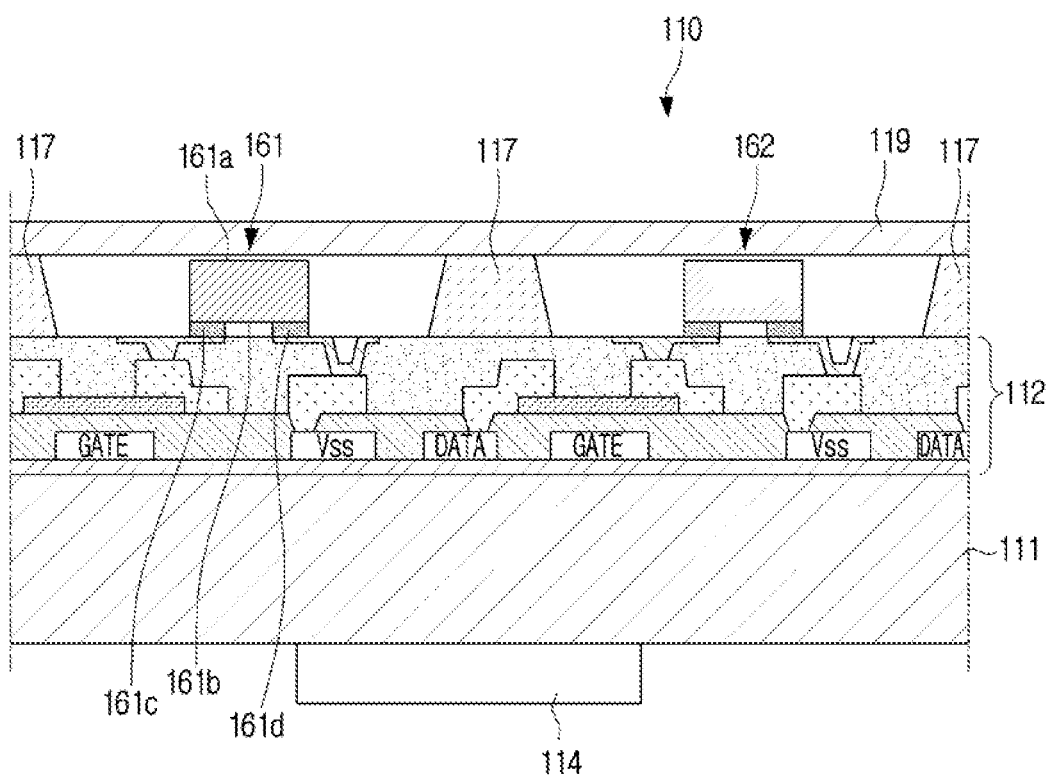
FIG. 3 is a cross-sectional view schematically illustrating a display module according to an embodiment.
Figure 4:
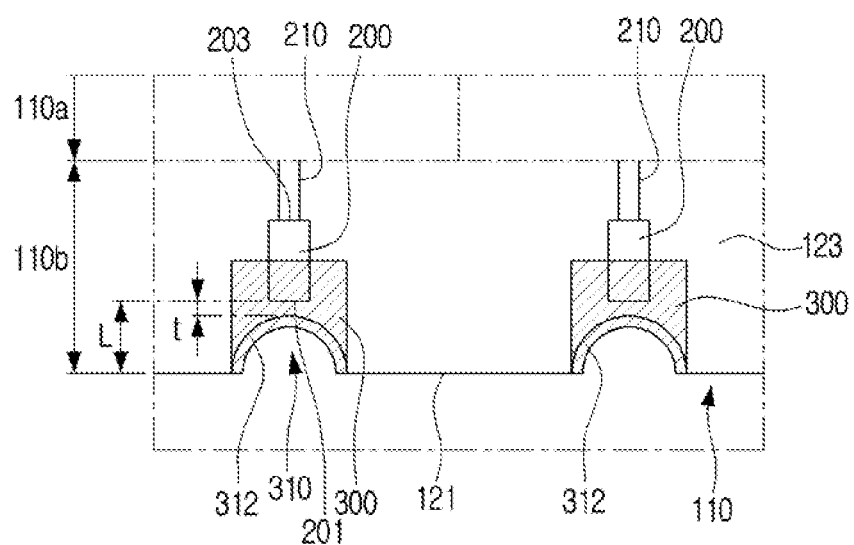
FIG. 4 is an enlarged view illustrating the IV portion shown in FIG. 1, and illustrating side wirings formed on the glass substrate.

FIG. 1 is a plan view schematically illustrating a display module according to an embodiment of the disclosure; FIG. 2 is a schematic view illustrating a pixel arranged on a TFT layer; FIG. 3 is a cross-sectional view schematically illustrating a display module according to an embodiment of the disclosure; FIG. 4 is an enlarged view illustrating the portion IV shown in FIG. 1, and illustrating side wirings formed on the glass substrate.

Referring to FIGS. 1 to 3, a display module 100 according to the disclosure may include a glass substrate 110.

The glass substrate 110 may include a plurality of transferred micro LEDs 161, 162, and 163 on a glass substrate. The glass substrate 110 may include a thin film transistor (TFT) layer 112 formed on the front surface of the glass substrate 110, and a wiring electrically connecting circuits disposed on the rear surface of the glass substrate 110. The glass substrate 110 includes an active region 110*a* that may display an image and an inactive region 110*b* that may not display an image.

The active region 110*a* may be divided into a plurality of pixel regions in which a plurality of pixels 150 are arranged respectively.

The plurality of pixel regions may be divided into various shapes, and may be divided into a matrix, for example. Each pixel region 151 may include a sub-pixel region 152 on which a plurality of pixels, that is, red LED, green LED, and blue LED are mounted, and a pixel circuit region 153 for driving each sub-pixel.

The plurality of micro LEDs 161, 162, and 163 may be transferred onto the pixel circuit region 153 of the TFT layer 112 and may be electrically connected to the electrodes 154, 155a, 157a, and 159a formed in the TFT layer 112. The common electrode 154 may be formed in a linear shape in consideration of the arrangement of the three LEDs 161, 162, and 163 arranged side by side.

Referring to FIG. 3, the micro LED 161 may include a light emitting surface 161a, and a pair of electrodes 161c and 161d may be disposed on an opposite surface 161b of the light emitting surface 161a. The remaining micro LEDs 162 and 163 may have a substantially the same structure as the micro LED 161.

The pixel driving method of the display module 100 according to an embodiment of the disclosure may be an AM driving method or a PM driving method. The display module 100 may form a pattern of wiring in which each micro LED is electrically connected according to an AM driving method or a PM driving method.

The inactive region 110b may include the front edge region of the glass substrate 110 and a plurality of connection pads 200 may be disposed in the inactive region 110b at predetermined intervals.

As shown in FIG. 4, a plurality of connection pads 200 may be spaced apart from each other in the inactive region 110b. The plurality of connection pads 200 may be electrically connected to each of the sub-pixels through the wiring 210. The plurality of connection pads 200 may be disposed on the edge region of the front surface and the edge region of the rear surface of the glass substrate 110, respectively.

The number of connection pads 200 formed in the inactive region 110b may vary depending on the number of pixels implemented on the glass substrate and may vary depending on the driving method of the TFT circuit disposed in the active region 110a. For example, an active matrix (AM) which individually drives each pixel may require more wirings and connection pads as compared to a passive matrix (PM) driving method for driving a plurality of pixels in a horizontal line and a vertical line by a TFT circuit disposed in the active region 110a.

Referring to FIG. 3, two sub-pixels 161, 162, among micro LEDs 161, 162, 163 included in a unit pixel are displayed, for convenience.

Referring to FIG. 3, in the display module 100, a plurality of micro LEDs 161, 162, and 163, each may be divided from each other by a black matrix 117, and a transparent cover layer 119 for protecting the plurality of micro LEDs 161, 162 and 163 and the black matrix 117 together may be provided. For example, a touch screen panel may be stacked on one surface of the transparent cover layer 119.

The plurality of micro LEDs 161, 162, and 163 may be made of an inorganic light emitting material, and may be a semiconductor chip capable of emitting light by itself when power is supplied. The plurality of micro LEDs 161, 162, and 163 may have a flip-chip structure in which the anode and cathode electrodes are formed on the same surface and the light emitting surface is formed on the opposite side of the electrodes. The plurality of micro LEDs 161, 162, and 163 may be formed of a square having a predetermined thickness and having the same width and length, or a rectangle having a different width and length. Such a micro LED may realize a high dynamic range (HDR) and may provide improved brightness and black display ability and a high contrast ratio compared to an OLED. The size of the micro LED may be 100 µm or less, or preferably 30 µm or less.

Referring to FIG. 4, side wirings 300 formed on the inactive region 110b of the glass substrate 110 may be formed on the recessed grooves 310 formed on the side 121 of the glass substrate.

The width of the inactive region 110b is approximately 0.5 times the pitch between the pixels in the active region, as one example, to keep the pitch between pixels at the boundary between adjacent display modules equal to the pitch between pixels in the single display module when connecting the plurality of display modules.

The recessed grooves 310 may be formed at a concave position of the glass substrate 110 by a predetermined depth from the side 121 of the glass substrate 110. As an example, the depth of the recessed grooves 310 is less than 0.2 times the pitch between pixels in the display module, and preferably about 0.125 times the pitch.

Figure 6A:
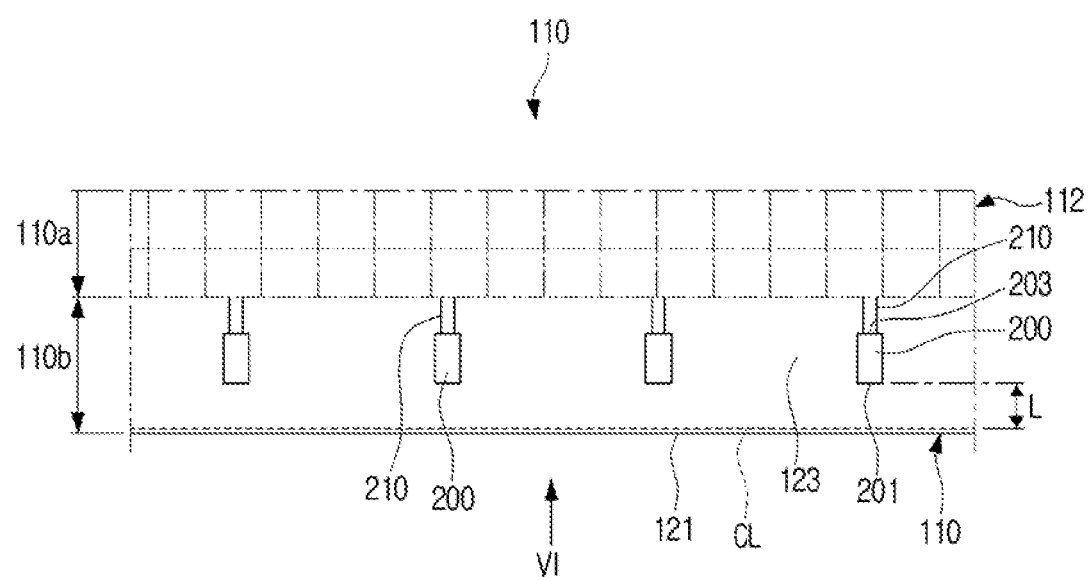
FIGS. 6A to 11B are views sequentially illustrating a manufacturing process of a display module of FIG. 5B according to an embodiment.
Figure 6B:
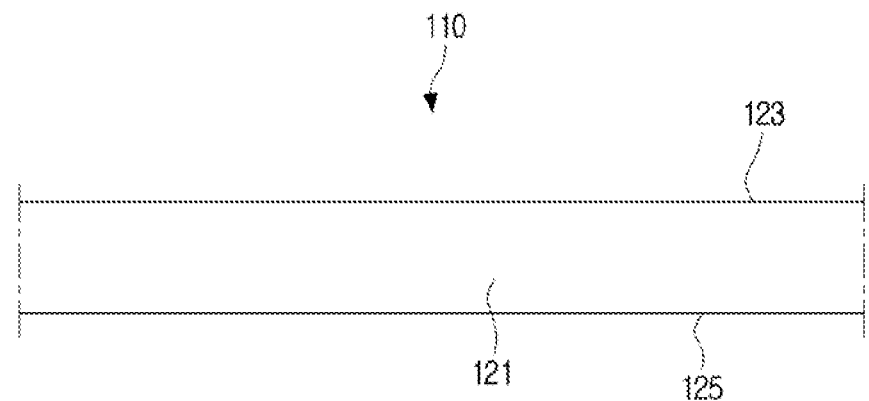

The side wirings 300 may be formed on the inner circumference of the recessed grooves 310, a part of the front surface 123 of the glass substrate 110 (corresponding to the inactive region 110b), and a part (corresponding to the rear portion adjacent to the side 121 of the glass substrate) of the rear surface 125 (see, e.g., FIG. 6B).

In this example, the side wirings 300 are formed to be connected to a portion of each of the inactive region of the front surface of the glass substrate, the recessed grooves, and the rear surface of the glass substrate, and opposite ends of the side wirings 300 may be electrically connected to the connection pads 200 disposed on the front and rear surfaces of the glass substrate, respectively.

Here, the front and rear surfaces of the glass substrate on which the connection pads 200 are disposed may refer to the edge region of the glass substrate. The edge region may include the side 121 of the glass substrate, a portion of the inactive region 110b of the front surface 123 of the glass substrate adjacent to the side 121, and a portion of the rear surface 125 of the glass substrate adjacent to the side 121.

The side wirings 300 may electrically connect the TFT circuit of the TFT layer 112 formed on the front surface of the glass substrate 110 with the driver circuit 114 disposed on the rear surface of the glass substrate 110. The driver circuit may be provided in a form of a driver integrated circuit chip.

The connection pad 200 has one end 201 spaced apart from the side 121 of the glass substrate by a predetermined distance L, and the other end 203 connected to the wiring 210 electrically connected to the TFT circuit.

The one end 201 of the connection pad 200 is spaced by a predetermined distance L in consideration of the distance between the recessed grooves 310 on which the side wirings 300 are formed. For example, the distance L may be in contact or adjacent to the recessed grooves 310 to minimize the length of the side wirings 300 on the front and rear of the glass substrate.

The side wirings 300 may be formed in the recessed grooves 310 as shown in FIG. 4 so as not to be formed at the outermost portion of the glass substrate 110, and may not be formed on the side 121 of the glass substrate excluding the recessed grooves 310. As described above, since the side wirings 300 are not formed at the outermost portion of the glass substrate 110, it is possible to protect the side wirings 300 from scratch and static electricity due to contact with the hand or a working device of a worker during the manufacture, delivery, and handling of the display module 100.

The recessed grooves 310 may have a chamfered surface 312 in edges adjacent to the front surface and the back surface of the glass substrate.

The chamfered surface 312 may be formed during a hole processing process for forming the recessed grooves 310, and may be formed by a separate processing process, for example, a grinding process after forming the recessed grooves through hole processing.

A smooth and not sharp surface is provided on the front surface 123 and the rear surface 125 of the substrate by the chamfered surface 312 formed by processing the front and rear edges of the recessed grooves 310. In this example, the thickness of a portion of the side wirings 300 formed at the edges of the recessed grooves 310 may be the same or similar to that of the other portion of the side wirings 300. Accordingly, it is possible to fundamentally prevent the side wirings 300 from being disconnected at the corner of the recessed grooves 310.

The chamfered surface 312 of the recessed grooves 310 may be formed to be inclined against the front surface or rear surface of the glass substrate 110 at predetermined angles.

In this example, the recessed grooves 310 may be located closer to the connection pad 200 than before the chamfered surface 312 is formed by processing of the chamfered surface 312. For example, as shown in FIG. 4, one end 201 of the connection pad formed on the front surface 123 of the glass substrate may maintain an interval t with respect to the chamfered surface 312. The one end 201 of the connection pad may be in contact with the chamfered surface 312 depending on the angle or length of the processed chamfered surface 312. The connection pads formed on the rear surface 125 of the glass substrate may also be spaced apart from or adjacent to the chamfered surface contacting the rear surface 125 of the glass substrate at an interval t.

The recessed grooves 310 may be formed with a fillet surface processed with a predetermined curvature, instead of the chamfered surface 312.

As described above, as the chamfered surface 312 is processed to prevent disconnection of the side wirings 300, a region in which the side wirings 300 can be formed on the edge of the recessed grooves 310 may be secured as wide as possible. Accordingly, a portion of the side wirings 300 formed on the chamfered surface may be formed to have a predetermined thickness (for example, a thickness equal to the thickness of another portion of the side wirings) to prevent disconnection.

In addition, since the edges of the recessed grooves 310 are formed at approximately a right angle, it is structurally vulnerable to breakage due to external impact and processing. In the disclosure, as the chamfered surface 312 is formed in the recessed grooves 310, the chamfered surface contacting the front surface of the glass substrate and the rear surface of the glass substrate may each form an obtuse angle, and the chamfered surface in contact with the front surface of the glass substrate and the rear surface of the glass substrate may each be structurally stable in accordance with an obtuse angle.

The glass substrate 110 may go through various processes after forming the side wirings 300. In this process, it is frequent that high heat is applied to the glass substrate 110, and the glass substrate 110 and the side wirings 300 are thermally expanded. Since the glass substrate 110 and the side wirings 300 are made of different materials, the thermal expansion ratio is also different. Therefore, as the edges of the recessed grooves 310 are formed at right angles due to the thermal expansion of the glass substrate 110 and the side wirings 300, the edges of the recessed grooves 310 may be damaged. A portion of the side wirings 300 located at the edge of the recessed grooves 310 may be disconnected. While the edges of the recessed grooves 310 are broken, the chamfered surface 312 having a predetermined area is formed by processing an edge of the recessed grooves 310 to relieve stress applied to an edge of the recessed grooves 310, thereby minimizing the disconnection of the side wirings 300 and securing the reliability of a product.

Figure 5A:
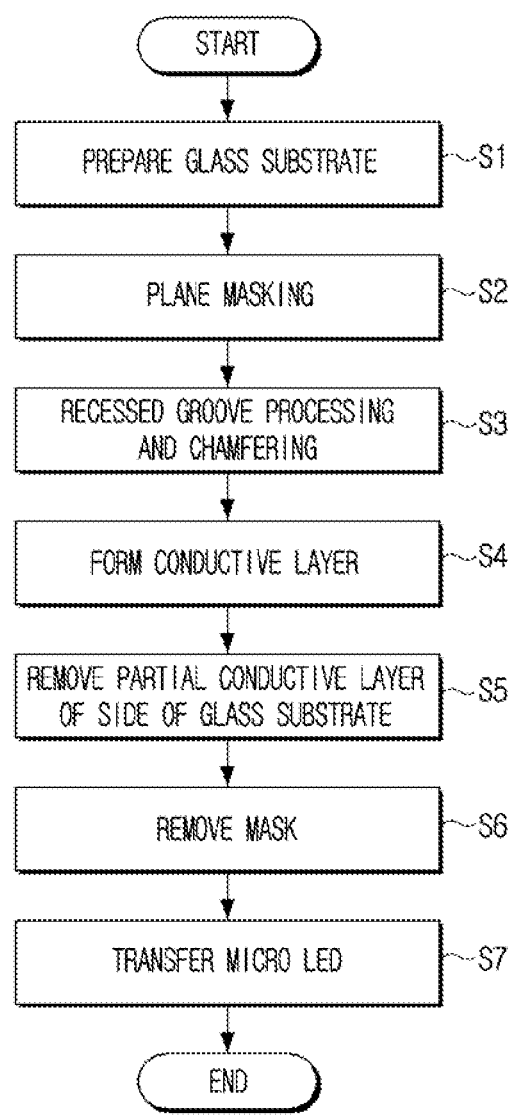
FIG. 5A is a flowchart illustrating a process of manufacturing a display module according to an embodiment.

Referring to FIG. 5A, a manufacturing process of a display module according to an embodiment will be described.

After preparing the glass substrate 110 formed with the TFT layer 112 on the front surface in S1, a mask is sequentially formed through a masking process on the front surface 123 and the rear surface 125, respectively in S2.

After forming the recessed grooves 310 through the hole processing on the side 121 of the glass substrate, the chamfered surface 312 is formed by processing opposite edges of the recessed grooves 310 through chamfering in S3.

A conductive layer is deposited on the whole of the side 121 of the glass substrate including the recessed grooves 310 and a portion of the front surface and rear surface of the glass substrate not covered by a mask in S4.

Next, the remaining portion of the conductive layer excluding the conductive layer formed on each recessed groove of the entire surface 121 of the glass substrate 121 is removed using a laser processing apparatus in S5. Specifically, a laser beam is irradiated onto the remaining conductive layer and removed, to leave a conductive layer in each recessed groove. The conductive layer which has not been removed and remains in each of the recessed grooves is used for the side wirings 300.

After removing all masks formed on the front surface 123 and the rear surface 125 of the glass substrate 110 in S6, a plurality of micro LEDs may be transferred to the TFT layer 112 of the glass substrate in S7 to form the display module 100.

Referring to FIGS. 5B and 6A to 11B, a manufacturing process of the display module according to an embodiment will be described sequentially.

Figure 5B:
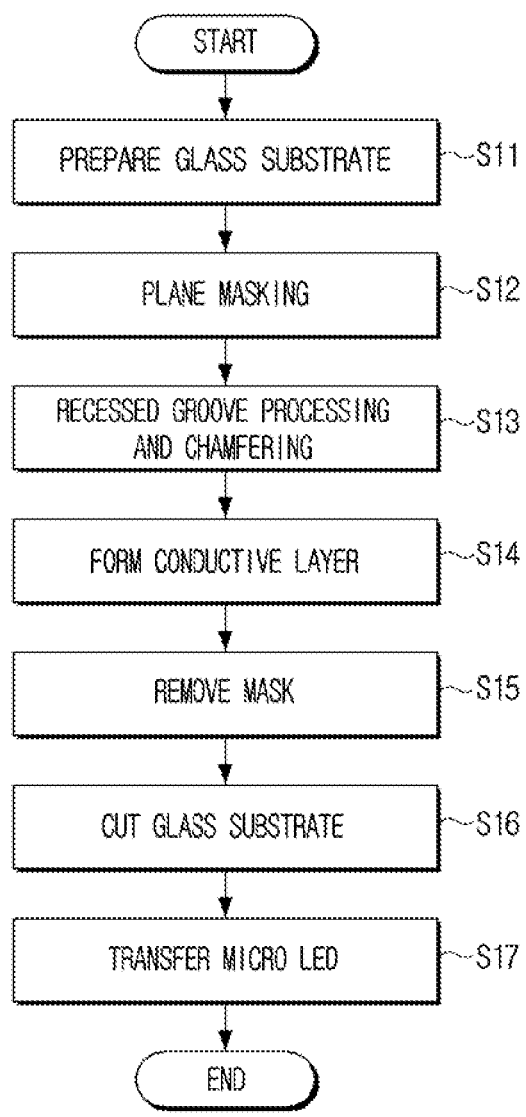
FIG. 5B is a flowchart illustrating a process of manufacturing a display module according to an embodiment.

FIG. 5B is a flowchart illustrating a process of manufacturing a display module according to an embodiment of the disclosure, but has a difference in some steps from the manufacturing process of FIG. 5A. FIG. 6A is a plan view illustrating a portion of the glass substrate 110 before forming the side wirings; and FIG. 6B is a side view taken along the arrow VI shown in FIG. 6A.

The glass substrate 110 formed with the TFT layer 112 on the front surface is prepared in S11. The glass substrate 110 is formed with the side wirings 300 with a predetermined interval on the edge region of the front surface 123 which is the inactive region 110b.

The other ends 203 of the side wirings 300 are electrically connected to the TFT circuit provided on the TFT layer 112 through wirings 210. The connection pad 200 is spaced apart from the cutting line CL of the glass substrate 110 by a predetermined distance L. A portion of the glass substrate 110 from the cutting line CL to a portion corresponding to the outermost side 121 of the glass substrate 110 is removed from the glass substrate 110 before the micro LED transfer process.

The rear surface 125 of the glass substrate may be formed with a plurality of connection pads, which are the same as those of the connection pads 200 described above, at regular intervals. One end of the connection pad formed on the rear surface 125 of the glass substrate may be spaced apart from the cutting line CL by a predetermined distance L and the other end may be electrically connected to a driver circuit 114 disposed on the rear surface 125 of the glass substrate.

Figure 7A:
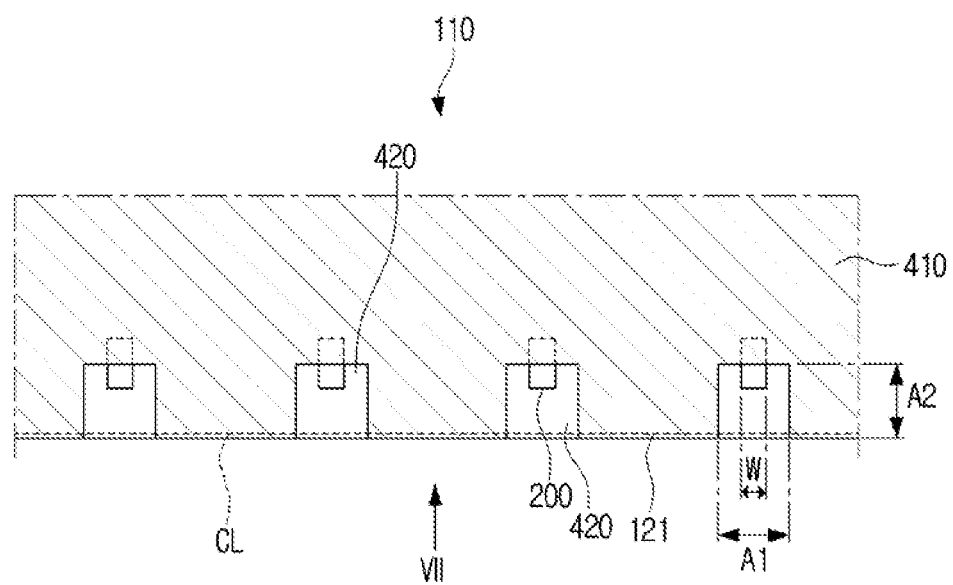
Figure 7B:
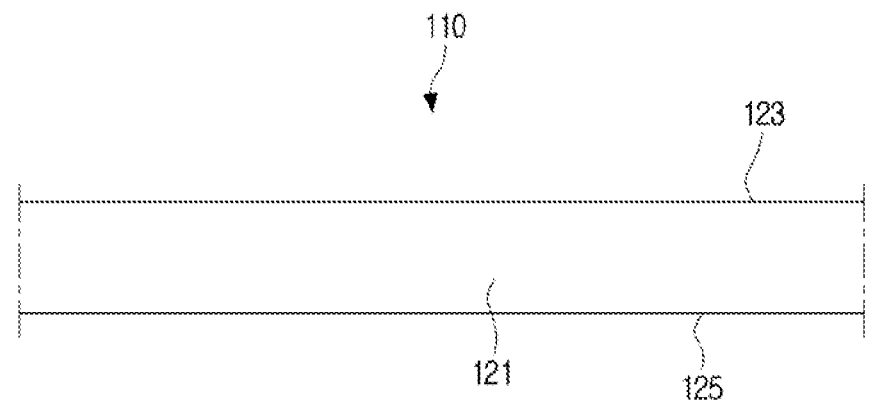

FIG. 7A is a plan view illustrating a portion of the glass substrate formed with a mask; and FIG. 7B is a side view taken along the arrow VII shown in FIG. 7A.

Referring to FIG. 7A, a mask 410 is sequentially formed on the front surface 123 and the rear surface 125 of the glass substrate through a masking process in S12.

In this example, the mask 410 is formed not to have a region 420 where the side wirings 300 are to be formed at the front surface 123 and the rear surface 125 of the glass substrate. A portion of the connection pad 200 is included in the region 420, and then, side wirings 300 formed on the glass substrate 110 are deposited to cover the connection pad 200 by a conductive layer deposition process so as to enable electrical connection with the connection pad 200.

The transverse length A1 of the area 420 not covered by the mask 410 is preferably greater than the width W of the connection pad 200 in the same direction, and the longitudinal length A2 is a length that includes a portion of the connection pad 200 (preferably one-half or more of the length of the connection pad). The transverse and longitudinal lengths A1 and A2 of the region 420 may be set in consideration of a contact area between the connection pad 200 and the side wirings 300.

Referring to FIG. 7B, the mask 410 is not formed on the side 121 of the glass substrate. The mask 410 is formed as two-dimensional (plane) masking on each of the front surface 123 and the rear surface 125 of the glass substrate.

Figure 8A:
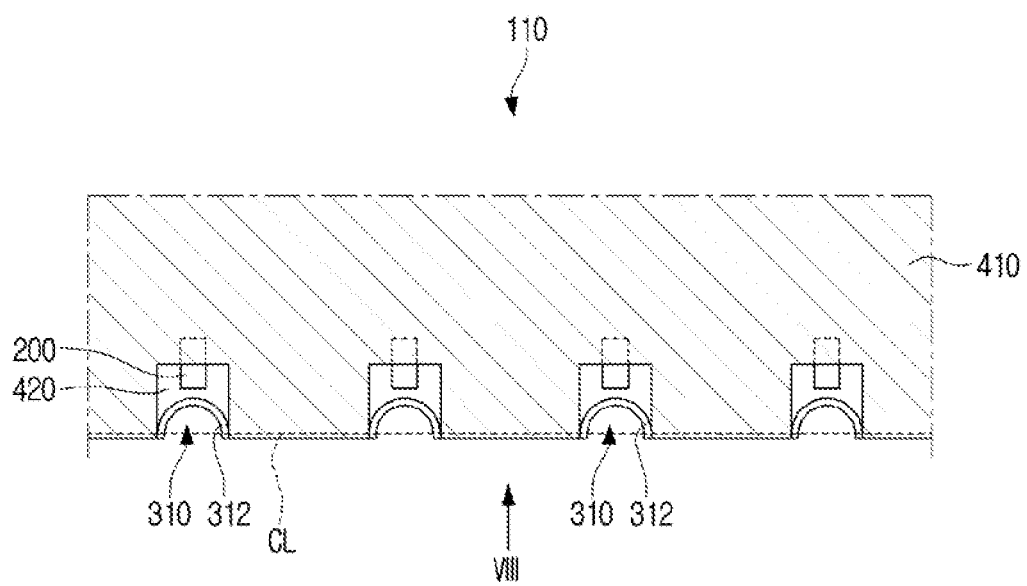
Figure 8B:
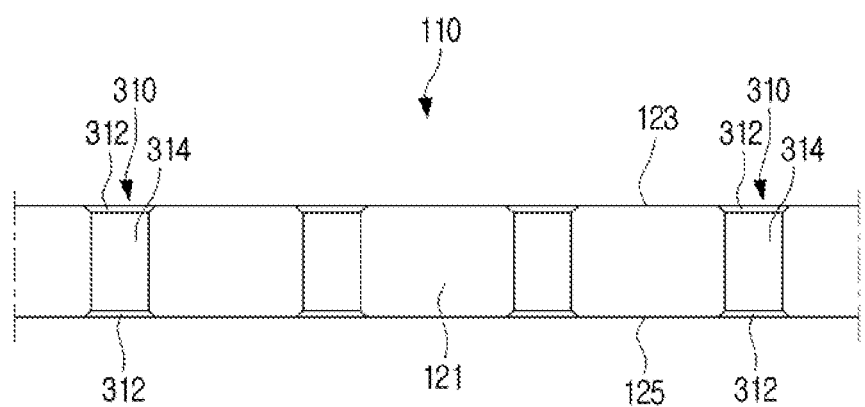

FIG. 8A is a plan view in which a portion of the front surface of the glass substrate in which the recessed grooves are formed at a side of the glass substrate and the front and rear edges of the recessed grooves are chamfered; and FIG. 8B is a side view taken along the arrow VIII shown in FIG. 8A.

Referring to FIGS. 8A and 8B, after the recessed grooves 310 are formed on the side 121 of the glass substrate, the chamfered surfaces 312 are formed by processing opposite edges of the recessed grooves 310 through chamfering in S13.

The recessed grooves 310 may be formed to correspond to the plurality of connection pads 200 of the glass substrate 110, and may be further formed for a wiring for a separate electrical connection between the TFT layer formed on the front surface of the glass substrate and the driver circuit 114 disposed on the rear surface of the glass substrate according to the selection of a circuit designer.

The number of recessed grooves 310 may be the same as or larger than the number of connection pads 200.

The recessed grooves 310 formed by hole processing may have a shape such that a cross-section is a semi-circle or a circumference.

The recessed grooves 310 formed on the side 121 of the glass substrate may be formed in a direction passing through the front surface 123 and the rear surface 125 of the glass substrate. In this case, the hole processing performed on the side 121 of the glass substrate may be formed to have a diameter along the cutting line CL as shown, e.g., in FIG. 8A.

The hole processing may be processed in different ways depending on the diameter of the recessed grooves 310. For example, when the diameter of the recessed grooves 310 is 150 μm at the minimum, a drill may be used for processing, and when the diameter of the recessed grooves 310 is 50 μm at the minimum, the laser beam may be irradiated for processing.

The chamfered surface 312 may be formed by chamfering edges to which the front surface 123 and the rear surface 125 of the glass substrate and the internal circumference 314 of the recessed grooves 310 are in contact, respectively.

Figure 9A:
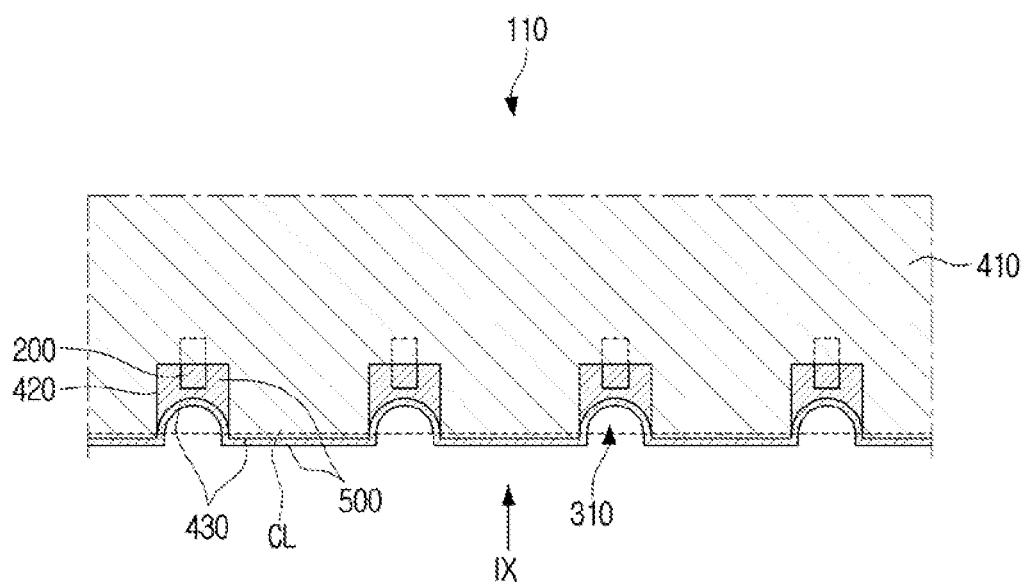
Figure 9B:
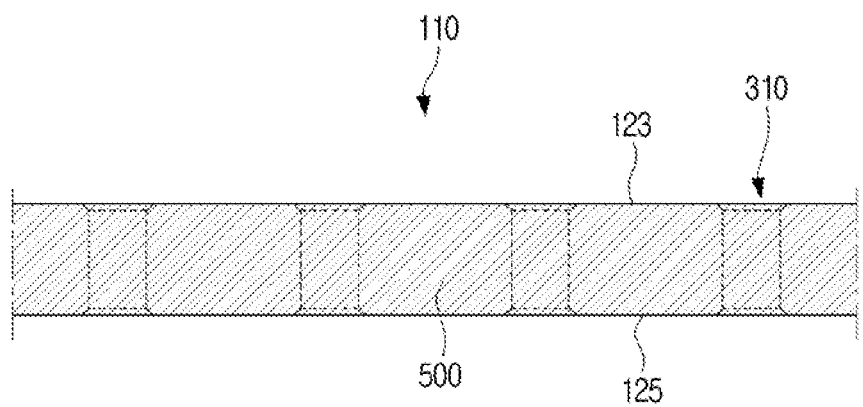

FIG. 9A is a plan view illustrating a portion of the front surface of the glass substrate illustrating a state in which a conductive layer is deposited on the glass substrate; and FIG. 9B is a side view taken along the arrow IX shown in FIG. 9A.

Referring to FIGS. 9A and 9B, a conductive layer 500 may be deposited on a whole of the side 121 including the recessed grooves 310 and a part of a region 420 of a front surface and a rear surface of the glass substrate 110 not covered by the mask 410 in S14.

The conductive layer 500 is to form the side wirings 300 and may be deposited and formed on the glass substrate 110 through sputtering, for example.

The conductive layer may be formed with a uniform thickness in a region not covered by the mask 410 on the glass substrate 110. In this example, the conductive layer 500 formed on a portion of the front surface 123 and the rear surface 125 of the glass substrate may cover the connection pad 200.

The conductive layer 500, which is deposited on the chamfered surface 312, may be formed to have the same or similar thickness, not thinner than the thickness deposited on the other portion of the glass substrate 110. Accordingly, it is possible to prevent the disconnection of the side wirings 300 at the front and rear edges of the recessed grooves 310.

Although the conductive layer 500 is formed on the glass substrate 110 by sputtering, the conductive layer 500 may be formed of any one of plating, screen printing, stamping, and the like. When the conductive layer is formed through these processes, a conductive layer is not formed in the masked region on the glass substrate 110.

Figure 10A:
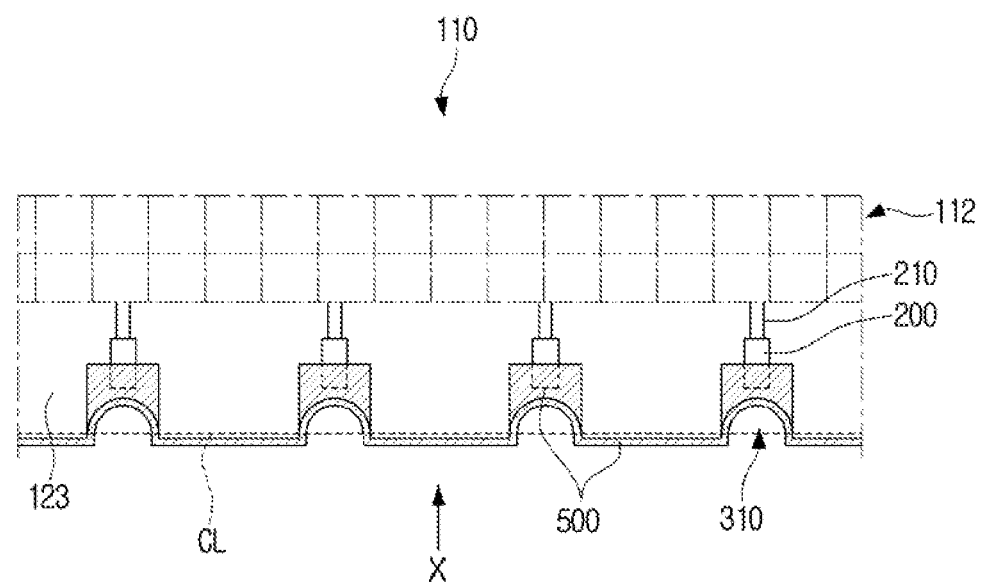
Figure 10B:
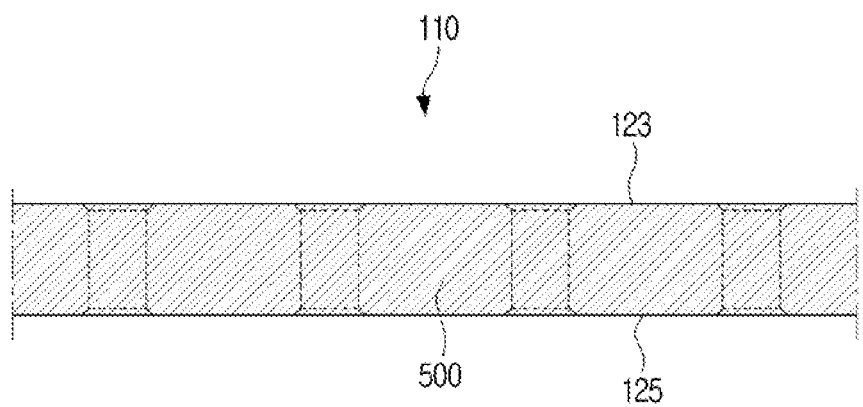

FIG. 10A is a plan view illustrating a portion of the front surface of the glass substrate in a state where a mask is removed; and FIG. 10B is a side view taken along the arrow X shown in FIG. 10A.

Referring to FIGS. 10A and 10B, all the masks 410 formed on the front surface 123 and the rear surface 125 of the glass substrate 110 are removed in S15.

In the state where the mask 410 is removed, the conductive layer 500 may be present on the side 121 of the glass substrate, the chamfered surface 312 and the inner circumferential surface 314 of the recessed grooves, and a portion of the front surface 123 and the rear surface 125 of the glass substrate.

Figure 11A:
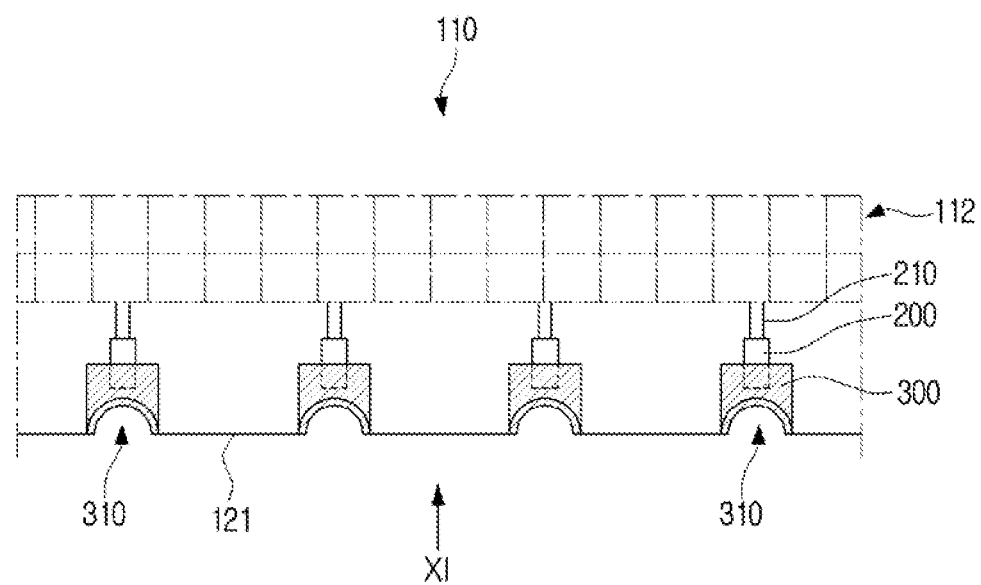
Figure 11B:
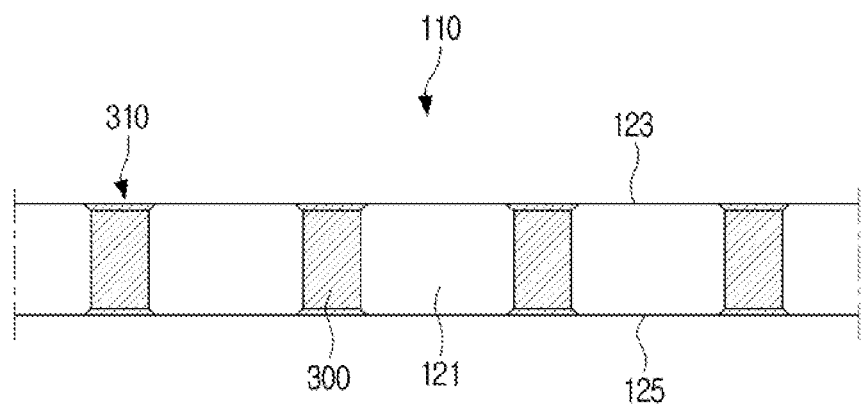

FIG. 11A is a plan view illustrating a portion of the front surface of the glass substrate in a state in which a portion of the glass substrate is removed; and FIG. 11B is a side view taken along the arrow shown in FIG. 11A.

Referring to FIGS. 11A and 11B, the outermost portion of the glass substrate with respect to a virtual cutting line CL (shown, e.g., in FIG. 10A) on the glass substrate 110 is removed in S16.

The process of removing a portion of the glass substrate 110 as described above may be performed by irradiating a laser beam along a cutting line CL. It is also possible to remove a portion of the glass substrate through a grinding process.

When the portion of the glass substrate 110 is removed, the remaining conductive layer except for the conductive layer formed in the recessed grooves 310 of the conductive layer 500 formed on the side 121 of the glass substrate is removed.

Accordingly, there may be the side wirings 300 in a shape connecting the internal circumference 314 and the chamfered surface 312 of the recessed grooves 310, a portion of the front surface 123 of the glass substrate, and a portion of the rear surface 125 of the glass substrate.

In the disclosure, side wirings may be formed without removing a portion of the glass substrate. For example, before the mask 410 is removed, the remaining conductive layer except for the conductive layer formed on the inner circumferential surface of the plurality of recessed grooves 310 may be irradiated with the laser beam to be removed from the side of the glass substrate. Accordingly, a conductive layer formed on the inner circumferential surface of the plurality of recessed grooves may form side wirings. In this example, the mask 410 is preferably removed after removing the conductive layer present in addition to the plurality of recessed grooves from the side of the glass substrate using the laser beam.

As described above, as the portion located at the side of the glass substrate 110 is formed on the inner circumferential surface 314 of the recessed grooves 310, the side wirings 300 are not located at the outermost portion of the glass substrate 110. Accordingly, since the side wirings 300 are not affected by static electricity applied from the outside or are minimally affected, it is possible to protect the TFT circuit of the glass substrate from static electricity and prevent the side wirings 300 from being disconnected due to scratches, or the like, applied to the side of the glass substrate.

After forming the side wirings 300 on the glass substrate 110 through the above-described process, the plurality of micro LEDs may be transferred to the TFT layer 112 of the glass substrate to form the display module 100 in S17.

The method of transferring micro LED may be performed through one of a laser transfer method, stamping transfer method, or pick and place method.

In the disclosure, a plurality of side wirings 300 may be disposed to face an edge region of an upper side of the glass substrate 110 and an edge region of a lower side as shown in FIG. 1.

However, without being limited thereto, the plurality of side wirings 300 may be disposed to face each of the left edge region and the right edge region of the glass substrate 110, respectively.

In addition, the plurality of side wirings 300 may be disposed in an edge region of one of four sides of the glass substrate 110 and an edge region of another side adjacent to the one side.

In the disclosure, since the side wirings 300 are formed on the recessed grooves 310 inserted into the glass substrate from the side of the glass substrate 110, an insulating layer for protecting the side wiring 300 may be formed on the side 121 of the glass substrate. In this case, the insulating layer may cover a portion of the side wirings 300 located on the front surface 123 and the rear surface 125 of the glass substrate.

A large display device manufactured by connecting the display module 100 may maximize the advantages of the modular display by suppressing the visibility of seams between the display modules 100. However, an insulating layer may be formed on the side 121 of the glass substrate to a thickness that does not affect the seams.

While example embodiments of the disclosure have been shown and described, the disclosure is not limited to the aforementioned specific embodiments, and it is apparent that various modifications can be made by those having ordinary skill in the technical field to which the disclosure belongs, without departing from the scope of the disclosure as described by the appended claims and their equivalents. Also, it is intended that such modifications are not to be interpreted independently from the technical idea or prospect of the disclosure.

What is claimed is:

1. A display module comprising:
   a glass substrate comprising a thin film transistor (TFT) layer arranged on a front surface of the glass substrate;
   a driver circuit disposed on a rear surface of the glass substrate, the driver circuit configured to drive the TFT layer;
   a plurality of light emitting diodes (LEDs) electrically connected to the TFT layer of the glass substrate;
   a plurality of first connection pads formed in an edge region of the front surface of the glass substrate so as to be electrically connected, through wiring, to a TFT circuit provided on the TFT layer;
   a plurality of second connection pads formed in an edge region of the rear surface of the glass substrate so as to be electrically connected to the driver circuit through wiring; and
   a plurality of side wirings formed in a plurality of recessed grooves arranged at intervals on a side of the glass substrate so that the plurality of side wirings are located at concave positions from the side of the glass substrate, the plurality of side wirings electrically connecting the plurality of first connection pads to the plurality of second connection pads,
   wherein the plurality of first connection pads and the plurality of second connection pads are spaced a predetermined distance inward from the side of the glass substrate, and
   wherein the plurality of recessed grooves are arranged so that opposite ends of the plurality of recessed grooves are located at positions corresponding to the plurality of first connection pads and the plurality of second connection pads, respectively.

2. The display module of claim 1, wherein each of the plurality of recessed grooves comprises a chamfered surface on at least one of a front edge of the glass substrate or a rear edge of the glass substrate.

3. The display module of claim 2, wherein the chamfered surface of each of the plurality of recessed grooves comprises:
   a first chamfered surface adjacent to a corresponding first connection pad of the plurality of first connection pads; and
   a second chamfered surface adjacent to a corresponding second connection pad of the plurality of second connection pads.

4. The display module of claim 1, wherein a number of the plurality of recessed grooves is larger than or equal to a number of the plurality of first connection pads.

5. The display module of claim 1, wherein each of the plurality of LEDs comprises a pair of electrodes disposed on an opposite side of a light emitting surface of the plurality of LEDs.

6. The display module of claim 3, wherein each of the plurality of side wirings is formed along the front surface and the rear surface of the glass substrate, along an inner circumference of a corresponding recessed groove of the plurality of recessed grooves, and along the first chamfered surface and the second chamfered surface of the corresponding recessed groove to form one side wiring.

7. The display module of claim 1, wherein each of the plurality of side wirings is formed along the inner circumference of the corresponding recessed groove so as to be positioned between the side of the glass substrate and a center of the glass substrate.

8. The display module of claim 1, wherein each of the plurality of side wirings is deposited to cover an edge region of a front surface of the glass substrate, an edge region of a rear surface of the glass substrate, a connection pad of the TFT layer, and an inner circumference of a corresponding recessed groove of the plurality of recessed grooves.

* * * * *